(12) United States Patent
Nagumo (10) Patent No.: US 6,381,189 B2
(45) Date of Patent: Apr. 30, 2002

(54) SEMICONDUCTOR REGISTER ELEMENT

(75) Inventor: Katsumi Nagumo, Kawasaki (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/791,729

(22) Filed: Feb. 26, 2001

(30) Foreign Application Priority Data

Mar. 3, 2000 (JP) ....................................... 2000-058059

(51) Int. Cl.$^7$ ................................................. G11C 7/00
(52) U.S. Cl. .................... 365/229; 365/226; 365/189.05
(58) Field of Search ................................ 365/229, 226, 365/228, 189.05

(56) References Cited

U.S. PATENT DOCUMENTS 6,021,082 A * 2/2000 Shirai ......................... 365/226

FOREIGN PATENT DOCUMENTS

| JP | 5-225360 | 9/1993 |
|---|---|---|
| JP | 10-143294 | 5/1998 |

* cited by examiner

*Primary Examiner*—Vu A. Le
(74) *Attorney, Agent, or Firm*—Parkhurst & Wendel, LLP (57) ABSTRACT

To provide a semiconductor register element being capable of reducing standby power consumption of a CMOS semiconductor integrated circuit. Upon shifting from a standby status to an operating status, firstly the application of input voltage is interrupted from elements other than temporary memory elements to the temporary memory elements. Next, the application of output voltage is interrupted from the temporary memory elements to the elements other than the temporary memory elements. Finally, the supply of source voltage is interrupted to the elements other than the temporary memory elements. In the steps of returning from a standby status to an operating status, firstly the supply of source voltage is resumed to the interrupted elements other than the temporary memory elements. Next, the application of output voltage is resumed from the temporary memory elements to the elements other than the temporary memory elements. Finally, the application of input voltage is resumed from the elements other than the temporary elements to the temporary memory elements.

8 Claims, 8 Drawing Sheets

SEMICONDUCTOR REGISTER ELEMENT

FIELD OF THE INVENTION

The present invention relates to technique for reducing power consumption during standby time of a CMOS semiconductor logic integrated circuit.

BACKGROUND OF THE INVENTION

In the present invention, standby time of an integrated circuit refers to a time period of a sleeping status or a non-operating status, in which the integrated circuit waits for input or occurrence of a certain predicted signal and shifts to a next predicted operation.

In the case of an electronic in which standby time makes up a large proportion relative to an operating time and a battery is used as a power voltage supply source, it has become a common practice to suspend almost all the operations of the integrated circuit and an operating clock of its surrounding circuit so as to cut the power consumption, thereby maximizing the life expectancy of the battery.

Further, in recent years, longer life expectancy of a battery has become increasingly important as a customers' criterion for purchasing a portable electronic and a goal of competitive performance.

Power leakage current of a CMOS semiconductor logic integrated circuit is categorized into leakage on a depletion layer for element separation, off leakage on a transistor channel, and leakage between wirings. In a time when a transistor has a minimum gate length of 1 μm or more, off leakage current of a transistor channel is smaller than reverse bias leakage current of the depletion layer, resulting in no problem.

However, at the present time of sub μm and deep sub μm, off leakage current of a transistor channel cannot be negligible as compared with other leakage currents.

This is why power consumption rises with increasing power leakage current during standby time of an MOS semiconductor logic integrated circuit.

In recent years, power consumption is likely to increase because of a larger number of transistors per chip of an integrated circuit, higher performance of an electronic, and the enhanced speed of an operating clock with faster response. Additionally, the demand for an electronic is shifted from a stationary electronic provided for each family to a portable electronic for each person, so that it is necessary to increase the life expectancy of a battery installed into an electronic. Furthermore, because of the need for a smaller and a thinner model, an electronic is downsized such that a permissible loss heat packaging capacity of an integrated circuit package is further limited and power consumption of that circuit is largely reduced under operation.

The most effective means for solving the above problem is to lower operating source voltage, which can reduce power consumption in inverse proportion nearly to the second power.

Therefore, in order to realize a low source voltage and a high-speed integrated circuit, the designer has set a gate threshold voltage of a transistor, which is installed into a semiconductor, at a voltage decreasing proportionally to source voltage, even though a channel-off leakage current is sacrificed to some extent.

However, a channel-off leakage current of the transistor is determined by semiconductor diffusion parameters such as a diffusion coefficient of the channel, a thickness of a gate oxide film, and a gate threshold voltage. Thus, under present circumstances, after the completion of the integrated circuit, the designer who installs the integrated circuit on the market into the electronic does not have any effective means for reducing power consumption increased by leakage current.

For this reason, the following measure (1-1) or (1-2) has been conventionally taken as a means for reducing power consumption during standby time.

(1-1) During standby time, memory information is held, which is necessary for continuing the operation of an integrated circuit, and a minimum source voltage is applied during standby time so as to immediately make a shift to the following operating status without formatting or resetting.

(1-2) In order to reduce a channel-off leakage current of the transistor, a high gate threshold voltage is applied during standby time to deepen a back gate bias voltage.

However, the use of the above means causes the following disadvantage (1-3) or (1-4).

(1-3) In case of (1-1), with a low source voltage applied during standby time, it is not possible to attain a design target value of power consumption during standby time because of quite too large a number of transistors provided in the integrated circuit.

(1-4) In case of (1-2), during standby time, a gate threshold voltage is increased higher than that of the operating status. Hence, in a CMOS semiconductor integrated circuit, a source voltage supply circuit is installed to set a back gate bias voltage higher than a source voltage on a P-channel transistor and lower than a ground voltage on an N-channel transistor, thereby increasing the cost.

Moreover, in case of (1-4), a back gate bias potential of each transistor is not direct-coupled to a source output with low impedance but is coupled to a high-impedance source output of a built-in source voltage supply circuit, which is less likely to incorporate a large-capacity capacitor for reducing power impedance. Thus, a latch-up withstand voltage is lowered by a parasitic transistor in the integrated circuit.

In order to lower the impedance of the internal source voltage supply circuit, it is necessary to append the source output on an external terminal of the integrated circuit and to externally connect a large-capacity bypass capacitor thereon.

Therefore, (1-3) is disadvantageous because the means is useless for reducing power consumption during standby time. (1-4) is disadvantageous because the cost is increased by adding the source voltage supply means.

In order to reduce power consumption during standby time of the CMOS semiconductor integrated circuit, the most effective means is to interrupt source voltage on a circuit part during standby time, which does not cause any problems in a subsequent resetting.

As for a timing function provided in an electronic, it is necessary to always apply source voltage regardless of standby time or operating time, because ticking is always required.

However, regarding a standby function of a mobile phone, a phone is in a standby status and its operation can be suspended to reduce the consumption of a battery source capacity, except for when the presence of an incoming call to its telephone number is intermittently confirmed at a fixed time interval.

In general, the integrated circuit is configured by the connection of a memory circuit, which always needs to store information for a continuous operation, and combinational logic gates, which do not have to store the information.

In the memory circuit, regarding register elements and memory elements (hereinafter, these elements are referred to as temporary memory elements) in which stored information is erased upon interruption of source voltage, if a means is adopted for preventing stored information from being erased, the object of the present invention can be attained even in the case where source voltage is interrupted on a logic gate element of the combinational logic gates, a buffer element, a permanent memory element for holding stored information under the interruption of source voltage, an analog function element, or other elements (hereinafter, these elements are referred to as elements other than the temporary memory elements).

Namely, in this case, in order to reduce power consumption during standby time, a proposal is made that a source voltage be applied only to the following (2-1) and (2-2) as the fewest elements having to receive source voltage in the integrated circuit during standby time and source voltage supply be totally suspended on the other elements except the temporary memory elements.

(2-1) All the temporary memory elements.
(2-2) Elements other than the temporary memory elements of the integrated circuit that make electrical connection with external devices of the integrated circuit and need to maintain electrical exchange of information or a controlling status and a controlled status with the external devices.

In the case where the transistors constituting all the integrated circuits including the above (2-1) and (2-2) are equal in size, namely, if the transistors are equal in channel-off leakage current, estimated standby power consumption can be reduced to a ratio of the number of transistors for elements other than the temporary memory elements to the number of transistors per chip.

However, when a source voltage is interrupted on the elements other than the temporary memory elements in the CMOS semiconductor integrated circuit, on which the temporary memory elements and the other elements are combined, the following problems (2-3) and (2-4) occur. Thus, it is not possible to hold stored information for returning from a standby status to an operating status just before the standby status. Further, power consumption during standby time cannot be reduced. Consequently, it has not been conventionally possible to totally interrupt source voltage applied to the elements other than the temporary memory elements during standby time.

(2-3) Regarding the elements other than the temporary memory elements that are connected to input terminals of the temporary memory elements, output voltage becomes unstable, so that information stored in the temporary memory elements is corrupted by unexpected setting, resetting, clocking, or trigger input of writing.

(2-4) Source voltage is interrupted on the elements other than the temporary memory elements that are connected to output terminals of the temporary memory elements, so that unexpected power leakage current is applied from source terminals of the temporary memory elements to the elements other than the temporary memory elements via the output terminals of the temporary memory elements, resulting in larger power consumption.

Therefore, in order to keep applying source voltage only to the temporary memory elements while maintaining information stored in the temporary memory elements just before a standby status, to interrupt source voltage on the elements other than the temporary memory elements, and to resume the application of source voltage to the elements other than the temporary memory elements so as to resume the operation in a state just before the standby status, the present invention aims to attain the following (2-5) and (2-6) regarding all the inputs, outputs, and I/O terminals of the temporary memory elements that connect the temporary memory elements and other elements, during the interruption of source voltage on the elements other than the temporary memory elements.

(2-5) A means for preventing the passage of the unstable voltage, which is described in the above(2-3), from the elements other than the temporary memory elements.
(2-6) A means for preventing the passage of the power leakage current, which is described in the above (2-4), to the elements other than the temporary memory elements.

SUMMARY OF THE INVENTION

A semiconductor register element described in claim 1 of the present invention is characterized in that in a circuit network of a CMOS semiconductor integrated circuit, a source voltage supply system is divided into a first source wiring and a second source wiring. The first source wiring feeds temporary memory element groups, which store information only when source voltage is applied, and the second source wiring feeds element groups other than the temporary memory element groups. The element groups other than the temporary memory element groups are each configured by a non-memory element group acting as combinational logic or a buffer, a permanent memory group for holding stored information even when source voltage is interrupted, an analog function element group, or other groups. Output logic is held and the passage of unstable logic is prevented from the element groups other than the temporary memory element groups that are connected to input terminals of the temporary memory elements in the temporary memory element groups. Thus, even when source voltage is interrupted on the element groups other than the temporary memory element groups that are connected to the input terminals of the temporary memory elements in the temporary memory element groups, the stored information of the temporary memory elements can be held without corruption in a state just before source voltage is interrupted on the elements other than the temporary memory element groups. Further, after resuming the supply of source voltage to the elements other than the temporary memory element groups, it is possible to resume the operation of the integrated circuit in a state just before the source voltage is interrupted.

A semiconductor register element described in claim 2 of the present invention is characterized by the following configuration in claim 1. Source voltage is interrupted on the elements other than the temporary memory element groups, the elements being connected to output terminals of the temporary memory elements. Thus, power leakage current can be prevented from passing through the elements other than the temporary memory element groups via source voltage supply terminals and the output terminals of the temporary memory elements.

A semiconductor register element described in claim 3 is characterized by the following configuration in claim 1. When a source voltage supply system is divided for the temporary memory element groups and the element groups other than the temporary memory element groups, the source voltage supply system is divided for the element groups other than the temporary memory element groups where the external devices connected to the integrated circuit need to electrically hold information exchange or a controlling and controlled status with the integrated circuit via the elements other than the temporary memory element groups even when source voltage of the element groups is interrupted. And the division is also made for the element groups other than the memory element groups where the external devices do not have to hold the information exchange or the controlling and controlled status.

A register element described in claim 4 of the present invention is characterized by the following configuration in claim 1. Under control of the temporary memory element groups, stored information of the temporary memory elements is held in a state just before source voltage is interrupted on the elements other than the temporary memory elements, and even though source voltage is interrupted on the elements other than the temporary memory elements that are connected to the input terminals of the temporary memory elements, the operation of the integrated circuit can be resumed in a state just before source voltage is interrupted, after the supply of source voltage is resumed to the element groups other than the temporary memory element groups.

A semiconductor register element described in claim 5 of the present invention is characterized by the following configuration in claim 1. Under control of the external devices connected to the external terminals of the integrated circuit, stored information of the temporary memory elements is held in a state just before source voltage is interrupted on the elements other than the temporary memory elements, and even though source voltage is interrupted on the elements other than the temporary memory elements that are connected to the input terminals of the temporary memory elements, the operation of the integrated circuit can be resumed in a state just before source voltage is interrupted, after the supply of source voltage is resumed to the element groups other than the temporary memory element groups.

A semiconductor register element described in claim 6 is characterized by the following configuration in claim 1. Under control of the temporary memory element groups, source voltage is interrupted on the elements other than the temporary memory elements that are connected to the output terminals of the temporary memory elements, so that power leakage current can be prevented from passing through the elements other than the temporary memory element groups via source voltage supply terminals and the output terminals of the temporary memory elements.

A semiconductor register element described in claim 7 is characterized by the following configuration in claim 3. Under control of the external devices connected to the external terminals of the integrated circuit source voltage is interrupted on the elements other than the temporary memory elements that are connected to the output terminals of the temporary memory elements, so that power leakage current can be prevented from passing through the elements other than the temporary memory element groups via source voltage supply terminals and the output terminals of the temporary memory elements.

A semiconductor register element described in claim 8 of the present invention, in claim 1 or 2, is characterized by performing the steps of holding output logic transmitted from the elements other than the temporary memory elements just before source voltage is interrupted on the elements other than the temporary memory elements that are connected to the input terminals of the temporary memory elements, preventing the passage of unstable logic just after source voltage is interrupted on the elements other than the temporary memory elements, preventing power leakage current appearing on the elements other than the temporary memory elements that are connected to the output terminals of the temporary memory elements, and then interrupting source voltage on the elements other than the temporary memory elements; and the steps of eliminating prevention of power leakage current appearing on the elements other than the temporary memory elements that are connected to the output terminals of the temporary memory elements just after the supply of source voltage is resumed to the elements other than the temporary memory elements, eliminating the holding of the output logic and prevention of unstable logic from the elements other than the temporary memory elements that are connected to the input terminals of the temporary memory elements, and then resuming the operation of the integrated circuit.

As a means for solving the foregoing problem, the following configuration is provided, which realizes the step of making shift to a standby status and returning to an operating status.

Namely, upon shifting from an operating status to a standby status, the following (3-1) to (3-3) are carried out in order.

(3-1) First, regarding all the input terminals such as setting, resetting, clocking, and data writing of the temporary memory elements connected to the output terminals of the elements other than the temporary memory elements, necessary input logic is held and passage of an unstable logic value is prevented from the elements other than the temporary memory elements after source voltage is interrupted.

(3-2) And then, the passage of current is interrupted from all the output terminals such as reading data of the temporary memory elements to the elements other than the temporary memory elements.

(3-3) Finally, the passage of source voltage is interrupted to the elements other than the temporary memory elements except for the foregoing (2-2).

Meanwhile, upon returning from a standby status to an operating status, the following (3-4) to (3-6) are carried out.

(3-4) First, the supply of source voltage is resumed on the interrupted elements other than the temporary memory elements.

(3-5) And then, the supply of voltage is resumed from all the output terminals such as reading data of the temporary memory elements to the elements other than the temporary memory elements.

(3-6) Finally, the supply of a signal is resumed from the output terminals of the elements other than the temporary memory elements to all the input terminals such as setting, resetting, clocking, and writing of the temporary memory elements. Since the above means are carried out in order, the foregoing (2-5) and (2-6) can be completed.

It is particularly significant to perform the steps from (3-1) to (3-2) and the steps from (3-4) to (3-5) in order to prevent stored information of the temporary memory elements from being corrupted. The corruption is caused by unstable input logic transmitted from the elements other than the temporary memory elements to the temporary elements.

According to the above configuration, since the configuration of a CMOS semiconductor integrated circuit has been increasingly fine, in the case of a mobile phone where a battery is necessary as a power voltage supply source, the semiconductor register elements of the present invention can achieve great effect by reducing standby power consumption with an increasing ratio of standby time serving as a receiving status to operating time serving as a conversation status.

DESCRIPTION OF PREFERRED EMBODIMENTS

Referring to FIGS. 1 to 8, the following will describe the embodiments of the present invention.
(Embodiment 1)

Embodiment 1 of FIGS. 1 to 6 specifically illustrates the configuration of a CMOS semiconductor integrated circuit realizing (3-3) and (3-4), an interrupting means for input logic after holding the input logic of the temporary memory elements in (3-1) and (3-6), and an interrupting means for output logic of the temporary memory elements for realizing (3-2) and (3-5).

Figure 1:
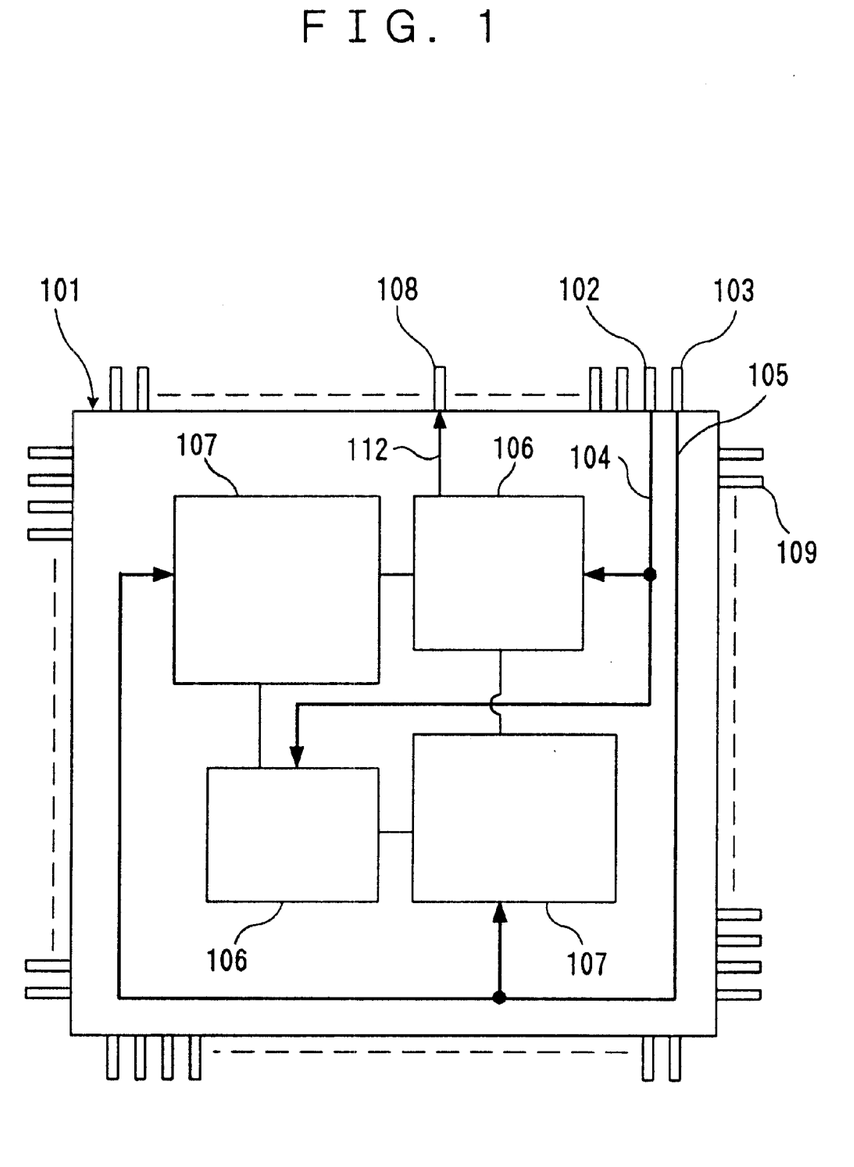
FIG. 1 is a block diagram showing a CMOS semiconductor integrated circuit according to Embodiment 1 of the present invention.

First, referring to FIG. 1, the following will discuss the configuration for supplying and interrupting source voltage to elements other than the temporary memory elements of the CMOS semiconductor integrated circuit.

In FIG. 1, a source voltage supply system of semiconductor element groups, which are provided in a CMOS semiconductor integrated circuit 101, are divided into a first source wiring 104 for temporary memory element groups 106 and a second source wiring 105 for element groups 107 other than the temporary memory element groups 106.

Here, the element groups 107 are element groups other than the temporary memory element groups 106. The element groups 107 are configured by a group of non-memory elements having a combinational logic and a buffer function, a group of permanent memory elements having stored information even when source voltage is interrupted, a groups of analog function elements, or other element groups.

To the temporary memory element groups 106, source voltage is supplied on standby and in action from a first external source terminal 102 of the integrated circuit 101 via the first source wiring 104.

Meanwhile, to the element groups 107, source voltage is supplied from a second external source terminal 103 of the integrated circuit 101 via the second source wiring 105 only when the integrated circuit is operated, and the source voltage is interrupted on standby.

An external output terminal 108 is an output terminal of a signal for controlling an external power circuit, which applies and interrupts source voltage to the second external source terminal 103 according to a standby status and an operating status of the integrated circuit 101. The terminal is connected via a signal wiring 112 to a status control circuit for controlling a standby status and an operating status in the temporary memory element group 106. Reference numeral 109 denotes an I/O terminal group.

The temporary memory element 106 is configured by an edge trigger flip flop shown in FIGS. 2 to 5.

In the configuration of FIGS. 2 to 5, an input interrupting circuit (during standby time, logic unstable input interrupting circuit) 209 for interrupting input from the outside of the flip flop and an output interrupting circuit (during standby time, power leakage current interrupting circuit) 218 for interrupting output to the outside of the flip flop are added to an equivalent circuit of the edge trigger flip flop configured by an ordinary slave latch 214, a master latch 215, and transfer gates 212a, 212b, 213a, and 213b included therein.

FIGS. 6(a) to 6(e) show the equivalent circuits of the transfer gates 207, 212a, 212b, 213a, and 213b.

The transfer gate 207 functions such that an output line 211 of FIGS. 2 to 5 allows passage of a signal with logic H and allows interruption of a signal with logic L. The transfer gates 212a and 212b function such that a clock output line 210 of FIGS. 2 to 5 allows passage of a signal with logic L and allows interruption of a signal with logic H. In contrast, the transfer gates 213a and 213b function such that the clock output line 210 allows interruption of a signal with logic L and allows passage of a signal with logic H.

Further, the transfer gates 212a and 213a are configured such that the clock output line 210 is gate-controlled by the output line 211.

Here, the output line 211 of FIGS. 2 to 6 is a connecting line from a switching input terminal 205 for switching between standby and operation. The clock output line 210 of FIGS. 2 to 6 is a connecting line from the clock input terminal 204.

Figure 2:
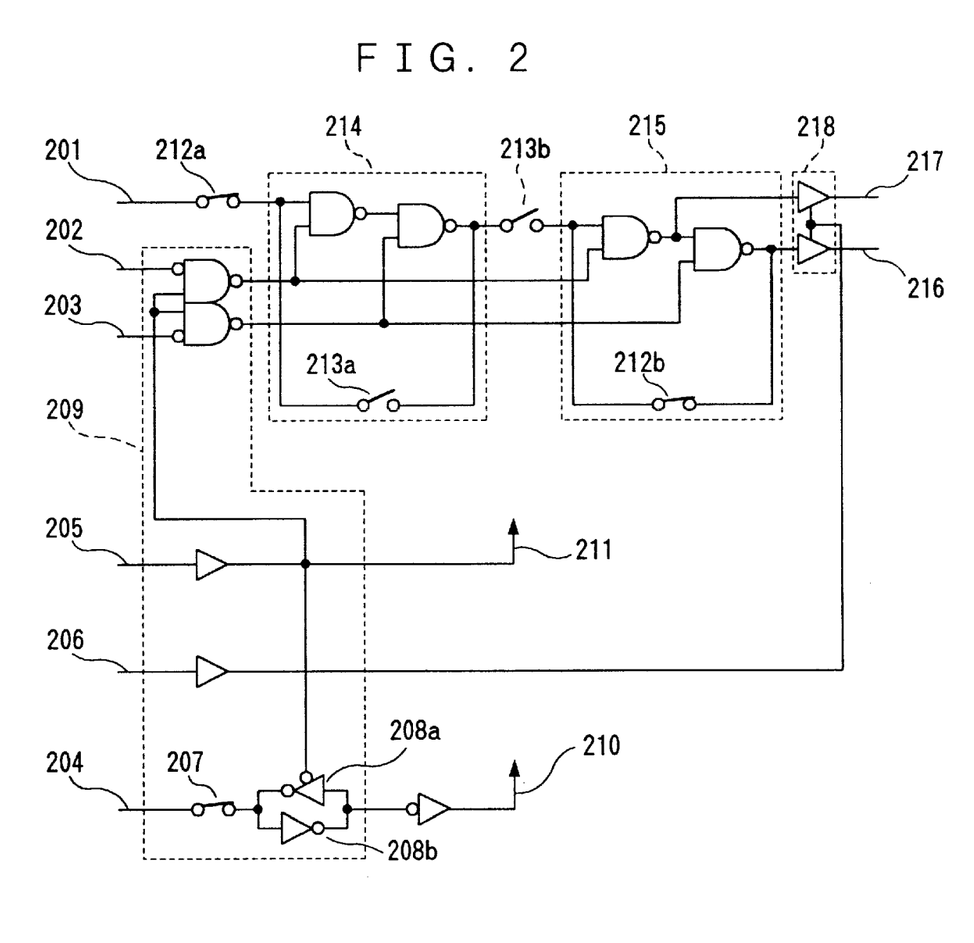
FIG. 2 is a diagram showing an equivalent circuit, in which an edge trigger flip flop is operated as a temporary memory element of Embodiment 1 and a master latch is operated.

The configurations of FIGS. 2 to 5 are different from one another as follows:

(4-1) In FIG. 2, assuming that the input terminal 205 of the input interrupting circuit 209 has logic H and a clock input terminal 204 has logic L, the transfer gates 212a and 212b enter a signal passage status, the transfer gates 213a and 213b enter a signal interruption status, and stored data of the flip flop is reflected on stored data of a master latch 215.

Figure 3:
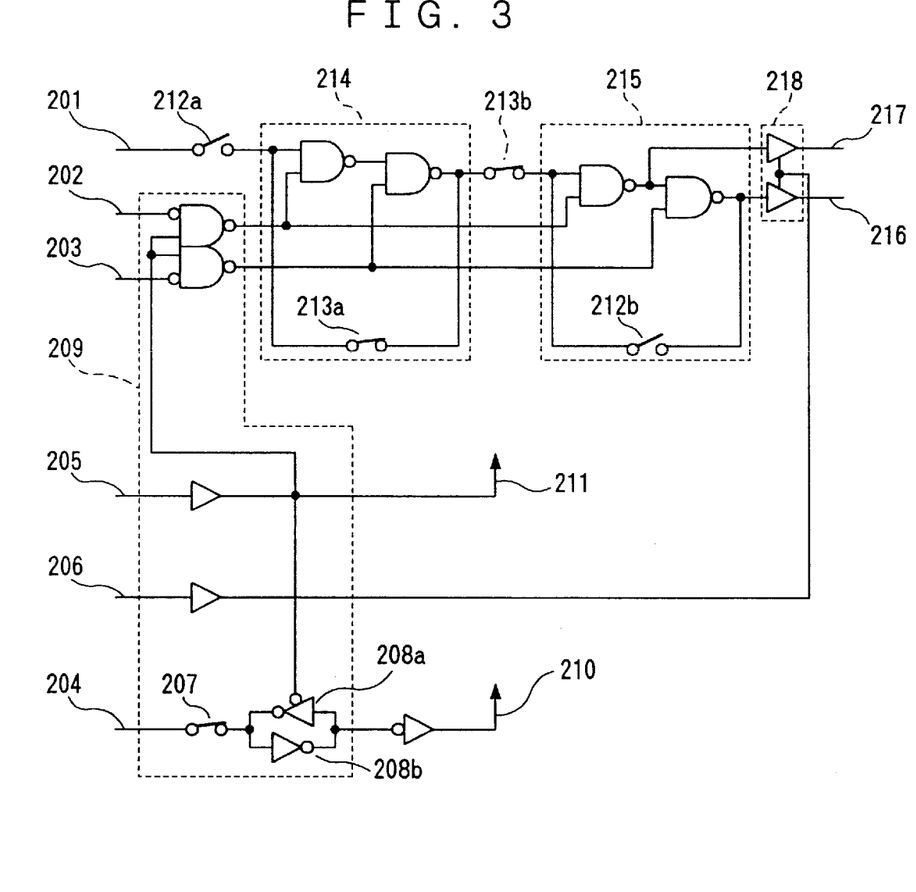
FIG. 3 is a diagram showing an equivalent circuit, in which the edge trigger flip flop is operated as a temporary memory element of Embodiment 1 and a slave latch is operated.

(4-2) In FIG. 3, assuming that the input terminal 205 of the input interrupting circuit 209 has logic H and the clock input terminal 204 has logic H, the transfer gates 212a and 212b enter a signal interruption status, the transfer gates 213a and 213b enter a signal passage status, and stored data of the flip flop is reflected on stored data of a slave latch 214.

Figure 4:
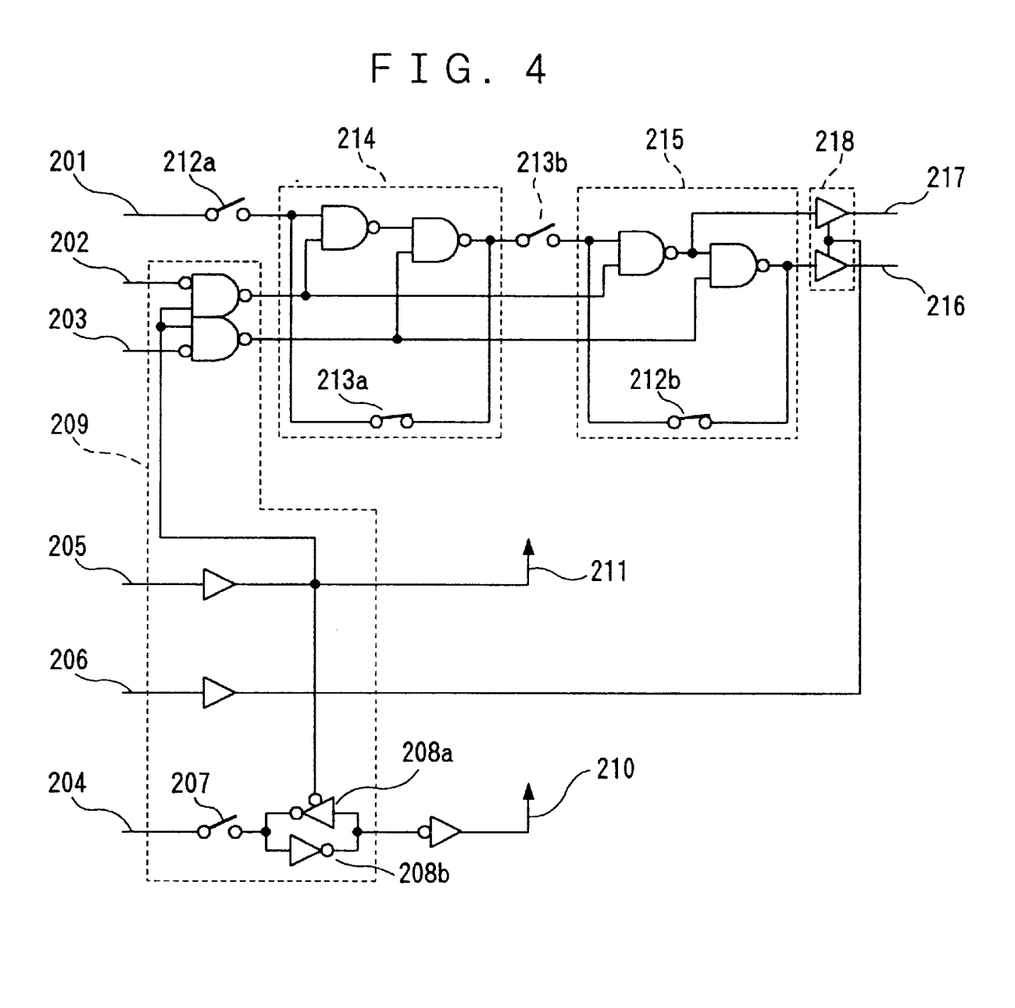
FIG. 4 is a diagram showing an equivalent circuit, in which the edge trigger flip flop is in a standby status and the master latch is operated, the flip flop holding clock input logic and data input logic just before the standby status, in FIG. 2 of Embodiment 1.

(4-3) In FIG. 4, assuming that the input terminal 205 of the input interrupting circuit 209 has logic L and the clock input terminal 204 has logic L, the transfer gates 213a and 212b enter a signal passage status, the transfer gates 212a and 213b enter a signal interruption status, and stored data of the flip flop is reflected on stored data of the master latch 215. Further, in contrast to (4-1), the slave latch 214 stores input logic of the data input terminal 201 just before a signal is interrupted at the transfer gate 212a.

Figure 5:
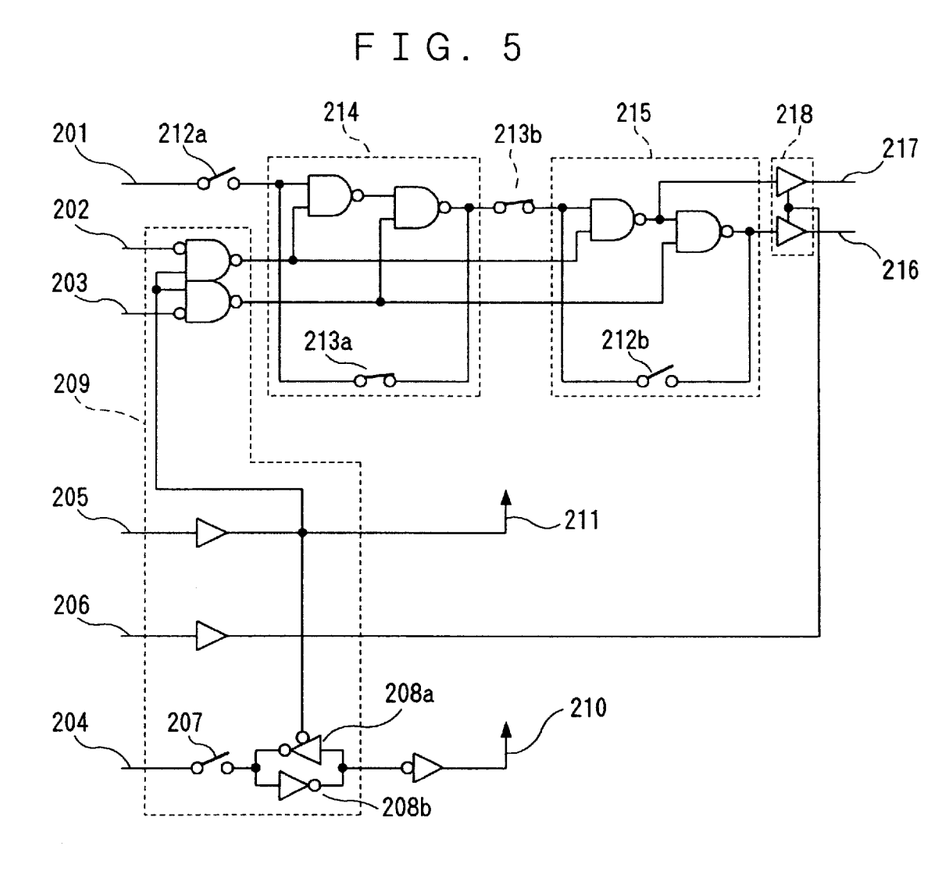
FIG. 5 is a diagram showing an equivalent circuit, in which the edge trigger flip flop is in a standby status and the slave latch is operated, the flip flop holding clock input logic and data input logic just before the standby status, in FIG. 3 of Embodiment 1.
Figure 6A:
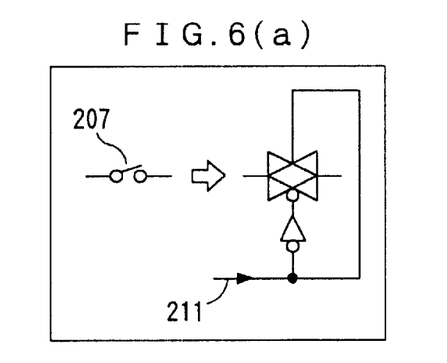
FIG. 6 is a diagram showing an equivalent circuit including transfer gates 207, 212a, 212b, 213a, and 213b, which are used in FIGS. 2 to 5 of Embodiment 1.
Figure 6B:
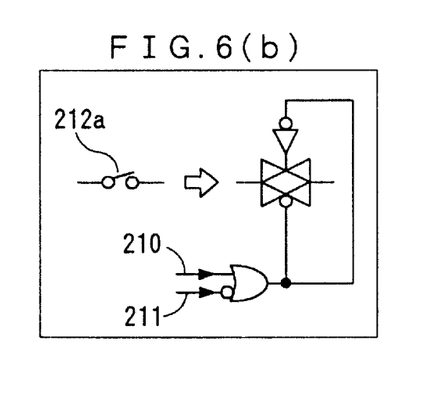
Figure 6C:
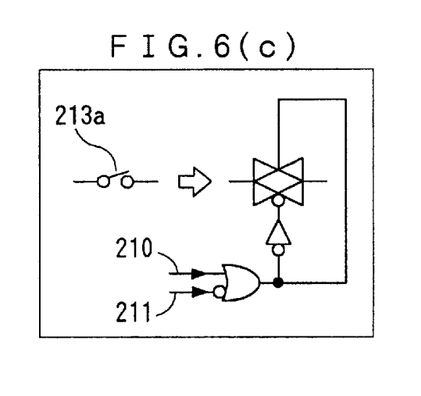
Figure 6D:
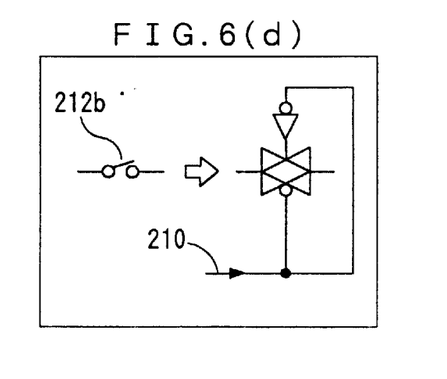
Figure 6E:
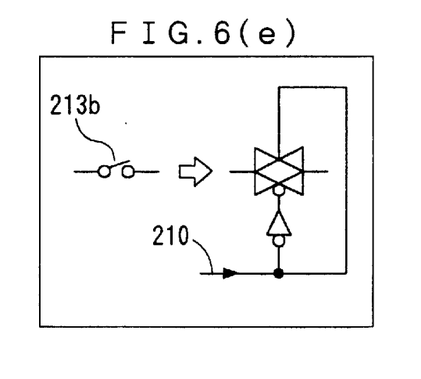

(4-4) In FIG. 5, assuming that the input terminal 205 of the input interrupting circuit 209 has logic L and the clock input terminal 204 has logic H, the transfer gates 213a and 213b enter a signal passage status, the transfer gates 212a and 212b enter a signal interruption status, and stored data of the flip flop is reflected on stored data of the slave latch 214. Further, in contrast to (4-3), display is provided in which the slave latch 214 stores input logic of the data input terminal 201 just before a signal is interrupted at the transfer gate 212a.

Furthermore, the input interrupting circuit 209 of FIGS. 2 to 5 is provided with the transfer gate 207, a tristate buffer 208a, and a buffer 208b. Even when source voltage is interrupted on the elements other than the temporary memory elements during standby time that are connected to the clock input terminal 204, it is possible to hold clock input logic just before a standby status. Hence, it is possible to prevent corruption on stored data of the flip flop.

Namely, in the case where the input terminal 205 has logic H, the transfer gate 207 enters a signal passage status, output of the buffer 208a is interrupted, and the transfer gate 207 simply acts as a buffer from the clock input terminal 204 to the output line 210. In the case where the input terminal 205 has logic L, the transfer gate 207 enters a signal interruption status, and the buffer 208a and the buffer 208b constitute a memory circuit, which acts such that clock input logic is held just before signal interruption on the transfer gate 207.

Meanwhile, in the output interrupting circuit 218 of FIGS. 2 to 5, in the case where power leakage current interrupting input terminal 206 has logic H during standby time, stored data of the master latch 215 is transmitted to a positive logic output terminal 216 and a negative logic output terminal 217 of the flip flop. In the case where the input terminal 206 has logic L, stored data of the master latch is interrupted so as to prevent source current from leaking from a source terminal to the outside of the flip flop through the master latch 215, the output terminal 206, and the transfer gate 207.

Namely, the above (4-1) and (4-2), in which logic H is applied to both of the input terminals 205 and 206 shown in FIGS. 2 to 5, describe the case where the edge trigger flip flop is normally operated. Meanwhile, the above (4-3) and (4-4), in which logic L is applied to both of the input terminals 205 and 206, describe the case where source voltage is interrupted on the elements other than the temporary memory elements and the edge trigger flip flop is brought to a standby status.

Therefore, the input terminals 205 and 206 act as switching input terminals for switching between an operating status and a standby status. The input terminals are connected to a switching output of a shift switching control circuit for switching between an operating status and a standby status. The control circuit is included in the temporary memory element groups of FIG. 1 and continuously receives source voltage during standby time.

In order to reduce power consumption during standby time, shift is made from an operating status to a standby status as follows in the above (4-1) and (4-2).

(4-5) First, input applied to the input terminal 205 of FIGS. 2 or 3 is switched from logic H of an operating status to logic L of a standby status, and output is interrupted, which is applied from the elements other than the temporary memory elements.

(4-6) Afterwards, input applied to the input terminal 206 of FIG. 2 or 3 is switched from logic H of an operating status to logic L of a standby status, and an input is interrupted, which is applied to the elements other than the temporary memory elements.

(4-7) Finally, source voltage is interrupted, which is applied from the second external source terminal 103 of FIG. 1 to the element groups 107 other than the temporary memory elements.

In the above (4-5), because of clock logic stored in the clock logic memory buffers 208a and 208b, when the logic is L, the transfer gates 212a and 213a enter the status of (4-3). In contrast, when the clock logic is H, the transfer gates 212a and 213a enter the status of (4-4), so that input data logic of the data input terminal 201 is held in the slave latch 214 just before a signal is interrupted at the transfer gate 212a.

Moreover, in the above (4-5), by switching the input applied to the input terminal 205 to logic L, input from a reset input terminal 202 and a set input terminal 203 is held as non-active logic, i.e., in a state in which neither reset nor set is not applied.

Thus, in the above (4-5), except for the switching input terminals 205 and 206 for switching between an operating status and a standby status, a signal is interrupted, which is applied from the outside to all the input terminals of the flip flop. Hence, even when the above (4-7) is carried out, stored data of the flip flop is not corrupted.

Meanwhile, shift is made from a standby status to an operating status as follows in the above (4-3) and (4-4).

(4-8) First, source voltage supply is resumed from the second external source terminal 103 of FIG. 1 to the element groups 107 other than the temporary memory elements.

(4-9) And then, input applied to the input terminal 206 of FIG. 4 or 5 is switched from logic L of a standby status to logic H of an operating status, and the application of input is resumed to the elements other than the temporary memory elements.

(4-10) Finally, after sufficient time elapsed until output logic is determined regarding the elements other than the temporary memory elements in the above (4-9), input applied to the input terminal 205 of FIG. 4 or 5 is switched from logic L of a standby status to logic H of an operating status, and the application of output is resumed from the elements other than the temporary memory elements.

In the above (4-9), stored data of all the flip flops is applied to the elements other than the temporary memory elements that are connected to the outputs of the flip flops. The stored data is held just before a standby status in the master latch 215 of FIG. 4 or the slave latch 214 of FIG. 5. Thus, output logic of all the elements other than the temporary memory elements can return to a status just before a standby status.

For this reason, in the above (4-9), regarding the data input terminal 201 and the clock input terminal 204, the inside and the outside of the flip flop conform to each other in logic. Regarding the reset input terminal 202 and the set input terminal 203, logic outside the flip flop returns to a status just before a standby status. Hence, with the above (4-10), it is possible to return to an operating status just before a standby status.

In order to estimate the effect of the present invention, assuming that in the above (4-7) source voltage can be interrupted on almost all of the elements other than the temporary memory elements and the temporary memory elements and the other elements are equal to each other in transistor size, there may be provided the effect of reducing standby power consumption proportional to:

(4-11) a reduction rate of standby power consumption≈the number of element transistors other than the temporary memory elements/the total number of transistors Assuming that the number of elements other than the temporary memory elements that interrupts source voltage on standby accounts for 70% of the total number of elements in the integrated circuit and the rest is in a standby status with an intermittent ratio of 1%, the following equation is established.

(4-12) a reduction value of power consumption both in a standby status and an operating status≈power consumption of supplying source voltage to the element groups other than the temporary memory element groups during standby time−power consumption of interrupting source voltage to the element groups other than the temporary memory element groups during standby time≈(power consumption during operating time×0.01+power consumption during standby time×0.99)−(power consumption during operating time× 0.01+power consumption during standby time×(1−0.7)× 0.99)≈power consumption during standby time for continuing the supply of source voltage to the elements other than the temporary memory elements×0.7×0.99

Hence, about 70% reduction can be estimated in power consumption. Further, the following equation is established.

(4-13) a growth rate for life expectancy of a battery≈1/(1−0.7)≈3.3

Thus, the life expectancy of a battery can be tripled or more.

(Embodiment 2)

Figure 8:
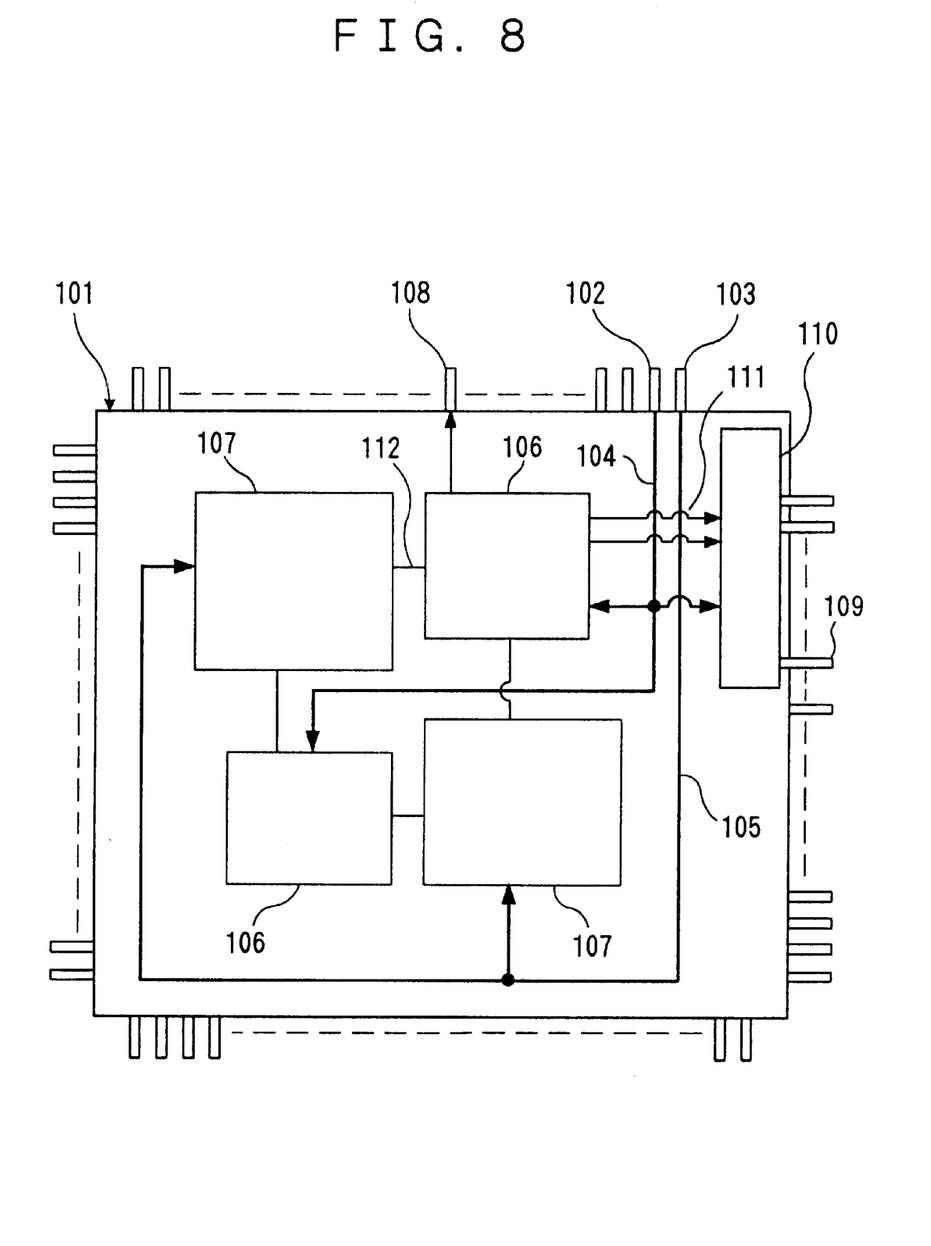
FIG. 8 is a block diagram showing a CMOS semiconductor integrated circuit according to Embodiment 2 of the present invention.

In Embodiment 2 shown in FIG. 8, regarding external devices connected electrically to a CMOS semiconductor integrated circuit 101, the configuration is provided for continuously supplying standby source voltage to buffer elements for external terminals in the integrated circuit and for holding logic just before a standby status, in order to prevent the following problems: source voltage is interrupted to elements other than temporary memory elements of the integrated circuit during standby time, so that output voltage becomes unstable on the external terminals of the integrated circuit and a problem appears on an electrical connection between the integrated circuit and the external devices, resulting in the external devices incapable of continuing its operation after returning to an operating status; and input leakage current of more than a product specification value passes from the external devices to the integrated circuit, so that power consumption during standby time cannot be reduced.

The following will discuss the configuration of FIG. 8, in which source voltage is supplied to the elements other than the temporary memory elements that require an electrical interface with the external devices of the CMOS semiconductor integrated circuit during standby time. Reference numeral 110 denotes an external I/O terminal buffer group, which is connected to the external devices having to hold an electrical interface with the integrated circuit during standby time.

In comparison with FIG. 1, FIG. 8 is additionally provided with external I/O terminals 109 having to hold an electrical interface with the integrated circuit 101 during standby time, the external I/O buffer group 110, and a signal line 111 connected to a register of a temporary memory element group 106 in the integrated circuit.

To the external I/O buffer group 110, in the same manner as the temporary memory element groups 106, source voltage is always supplied from a first external source terminal 102, which receives source voltage both on standby and in action, via a first source wiring 104.

The above means makes it possible to apply stored register information, which is obtained just before a standby status of the temporary memory element groups 106, from the external I/O terminal 109 to the external devices via the external I/O buffer group 110 during standby time. Thus, the external devices can maintain a status obtained just before a standby status and immediately return to an operating status when making shift.

Further, according to the above means, in the same manner as the operating status, output from the external devices is received by the external I/O buffer group 110 via the external I/O terminal 109 during standby time. Hence, the means is used for absorbing surge voltage to the external I/O terminal 109, so that leakage current does not appear when source voltage is interrupted, which passes through a reverse bias application diode included in the buffer group. Consequently, it is possible to prevent an increase in power consumption during standby time.

As described above, the present invention is provided with a means for dividing the source voltage supply system shown in FIG. 1 or 8, and the temporary memory elements including an input signal interrupting means 209 and an output signal interrupting means 218 of FIG. 2. With the steps of (3-1) to (3-6), standby power consumption can be reduced in the CMOS semiconductor integrated circuit.

(Embodiment 3)

Figure 7:
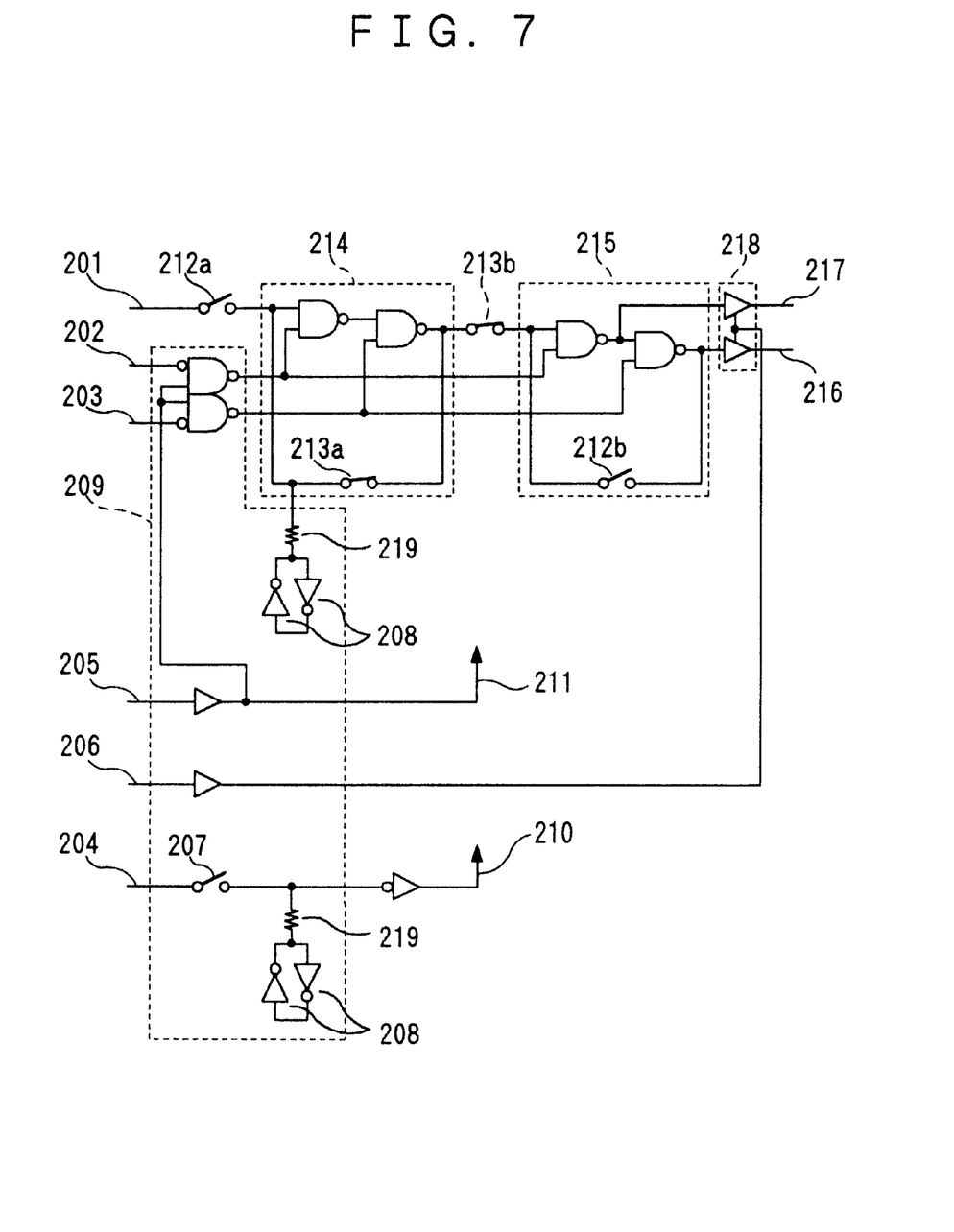
FIG. 7 is a diagram showing an equivalent circuit of Embodiment 3.

FIG. 7 shows another example of the flip flop described in Embodiment 1.

In FIG. 7, instead of the means for holding clock input logic, which is obtained just before a standby status of FIG. 4 or 5, by using a latch configuration including a transfer gate 207 and buffers 208a and 208b, and the means for holding data input logic by using the transfer gates 212a and 213a, latches including the buffers 208 and resistors 219 which reduce driving capacity of buffers 208 are provided at a clock input and a data input of the flip flop. Therefore, in the above (4-3) and (4-4), it is possible to hold clock input logic and data input logic in a state just before a standby status.

What is claimed is:

1. A semiconductor register element, wherein in a circuit network of a CMOS semiconductor integrated circuit, a source voltage supply system is divided into a first source wiring and a second source wiring, said first source wiring feeding a temporary memory element group, which stores information only when source voltage is applied, said second source wiring feeding an element group other than said temporary memory element group, said element group other than said temporary memory element group being constituted by a non-memory element group acting as combinational logic or a buffer, a permanent memory group for storing information even when source voltage is interrupted, an analog function element group, or other groups, and wherein output logic is held and passage of unstable logic is prevented from said element group other than said temporary memory element group that is connected to an input terminal of a temporary memory element in said temporary memory element group, so that even when source voltage is interrupted on said element group other than said temporary memory element group that is connected to said input terminal of said temporary memory element in said temporary memory element group, said stored information of said temporary memory element is held without corruption in a state just before source voltage is interrupted on an element other than said temporary memory element group, and after resuming supply of source voltage to said element other than said temporary memory element group, an operation of said integrated circuit is resumed in a state just before said source voltage is interrupted.

2. The semiconductor register element as set forth in claim 1, wherein source voltage is interrupted on said element other than said temporary memory element group, said element being connected to an output terminal of said temporary memory element, so that power leakage current is prevented from passing through said element other than said temporary memory element group via a source voltage supply terminal and said output terminal of said temporary memory element.

3. The semiconductor register element as set forth in claim 1, wherein when said source voltage supply system is divided into said temporary memory element group and said element group other than said temporary memory element group, said source voltage supply system is divided into said element group other than said temporary memory element group where an external device connected to said integrated circuit needs to electrically hold information exchange or a controlling and controlled status with said integrated circuit via said element other than said temporary memory element group even when source voltage of said element group is interrupted, and said element group other than said memory element group where said external device having no necessity of holding said information exchange or said controlling and controlled status.

4. The semiconductor register element as set forth in claim 1, wherein under control of said temporary memory element group, stored information of said temporary memory element is held in a state just before source voltage is interrupted on said element other than said temporary memory element, and even though source voltage is interrupted on said element other than said temporary memory element that is connected to said input terminal of said temporary memory element, an operation of said integrated circuit is resumed in a state just before source voltage is interrupted, after supply of source voltage is resumed to said element group other than said temporary memory element group.

5. The semiconductor register element as set forth in claim 3, wherein under control of said external device connected to said external terminal of said integrated circuit, stored information of said temporary memory element is held in a state just before source voltage is interrupted on said element other than said temporary memory element, and even though source voltage is interrupted on said element other than said temporary memory element that is connected to said input terminal of said temporary memory element, an operation of said integrated circuit is resumed in a state just before source voltage is interrupted, after supply of source voltage is resumed to said element group other than said temporary memory element group.

6. The semiconductor register element as set forth in claim 1, wherein under control of said temporary memory element group, source voltage is interrupted on said element other than said temporary memory element that is connected to an output terminal of said temporary memory element, so that power leakage current is prevented from passing through said element other than said temporary memory element group via a source voltage supply terminal and said output terminal of said temporary memory element.

7. The semiconductor register element as set forth in claim 3, wherein under control of said external device connected to said external terminal of said integrated circuit, source voltage is interrupted on said element other than said temporary memory element that is connected to an output terminal of said temporary memory element, so that power leakage current is prevented from passing through said element other than said temporary memory element group via a source voltage supply terminal and said output terminal of said temporary memory element.

8. The semiconductor register element as set forth in claim 1 or 2, wherein the steps are performed of holding output logic transmitted from said element other than said temporary memory element just before source voltage is interrupted on said element other than said temporary memory element that is connected to said input terminal of said temporary memory element, preventing passage of unstable logic just after source voltage is interrupted on said element other than said temporary memory element, preventing power leakage current appearing on said element other than said temporary memory element that is connected to said output terminal of said temporary memory element, and then interrupting source voltage on said element other than said temporary memory element; and the steps are performed of eliminating prevention of power leakage current appearing on said element other than said temporary memory element that is connected to said output terminal of said temporary memory element just after supply of source voltage is resumed to said element other than said temporary memory element, eliminating said holding of said output logic and prevention of unstable logic from said element other than said temporary memory element that is connected to said input terminal of said temporary memory element, and then resuming an operation of said integrated circuit.

* * * * *